(12) United States Patent
Jeng

(10) Patent No.: US 7,393,745 B2
(45) Date of Patent: Jul. 1, 2008

(54) METHOD FOR FABRICATING SELF-ALIGNED DOUBLE LAYERED SILICON-METAL NANOCRYSTAL MEMORY ELEMENT

(75) Inventor: Pei-Ren Jeng, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 97 days.

(21) Appl. No.: 11/462,250

(22) Filed: Aug. 3, 2006

(65) Prior Publication Data

US 2007/0105307 A1 May 10, 2007

(30) Foreign Application Priority Data

Nov. 7, 2005 (TW) ................................ 94138939 A

(51) Int. Cl.
*H01L 21/336* (2006.01)
(52) U.S. Cl. ................. 438/257; 257/E21.68; 438/593; 438/150
(58) Field of Classification Search ................. 438/257, 438/593, 150; 257/E21.68, E29.129
See application file for complete search history.

(56) References Cited

U.S. PATENT DOCUMENTS

| 5,714,766 | A * | 2/1998 | Chen et al. ................... 257/17 |
|---|---|---|---|
| 6,344,403 | B1 * | 2/2002 | Madhukar et al. ........... 438/503 |
| 6,784,103 | B1 * | 8/2004 | Rao et al. .................... 438/680 |
| 7,019,391 | B2 * | 3/2006 | Tran ........................... 257/678 |
| 7,170,223 | B2 * | 1/2007 | Smith et al. ................. 313/495 |
| 2006/0121661 | A1 * | 6/2006 | Yang et al. .................. 438/197 |
| 2006/0231889 | A1 * | 10/2006 | Chen et al. .................. 257/325 |
| 2007/0018342 | A1 * | 1/2007 | Sandhu et al. ....... 257/E29.071 |

OTHER PUBLICATIONS

Ryuji Ohba, Naoharu Sugiyama, Ken Uchida, Junji Koga and Akira Toriumi, "Non-Volatile Si Quantum Memory With Self-Aligned Doubly-Stacked Dots," Electron Devices Meeting, 2000. IEDM Technical Digest, International Publication Date: 2000; (c) 2000 IEEE, pp. 313-316, ISBN 0-7803-6438-4.

* cited by examiner

*Primary Examiner*—Thao P. Le
(74) *Attorney, Agent, or Firm*—WPAT, P.C.; Anthony King

(57) ABSTRACT

A nanocrystal memory element and a method for fabricating the same are proposed. The fabricating method involves selectively oxidizing polysilicon not disposed beneath and not covered with a plurality of metal nanocrystals, and leaving intact the polysilicon disposed beneath and thereby covered with the plurality of metal nanocrystals, with a view to forming double layered silicon-metal nanocrystals by self-alignment.

8 Claims, 6 Drawing Sheets

US 7,393,745 B2

METHOD FOR FABRICATING SELF-ALIGNED DOUBLE LAYERED SILICON-METAL NANOCRYSTAL MEMORY ELEMENT

CROSS-REFERENCE TO RELATED APPLICATION

This application claims the benefit of Taiwan Application No. 094138939, filed Nov. 7, 2005, the contents of which are hereby incorporated herein by reference in their entirety.

FIELD OF THE INVENTION

The present invention relates to a memory device and a method for fabricating the same, and more particularly, to a nanocrystal memory for accessing charges and a method for fabricating the same.

BACKGROUND OF THE INVENTION

Among existing non-volatile memory-based ICs, flash memory is the most advanced of its kind. A distinguishing feature of a conventional flash memory is that, in addition to an oxide insulating layer typically formed in a conventional MOSFET, a floating gate is formed in between a gate and a channel in the MOS of the tradition flash memory, such that data are stored by introducing into or removing from the floating gate negative charges. However, as regards conventional flash memory, the gate is made of doped polysilicon. With the conventional floating gate, electric conduction is achieved, using charges stored in doped polysilicon which forms the floating gate. Charges are stored in the doped polysilicon and thus they move freely within the doped polysilicon. Charges will hardly be maintained in the doped polysilicon, if there is a current leakage from any point of a tunnel oxide layer beneath the polysilicon floating gate. Moreover, the tunnel oxide layer will have to be thinned down if the size of the memory is to be reduced. However, whatever thinning-down effort is subject to the physical limit of direct tunneling, and thus a thinning down process does have its own limit.

In view of this, U.S. Pat. No. 5,714,766 proposes a nano-structure memory device. FIG. 1 (PRIOR ART) is a cross-sectional view of a nanocrystal memory 100 known in the prior art. The nanocrystal memory 100, which has a basic structure of a transistor comprising a substrate 101, a source 102, a drain 103, a tunnel oxide layer 104, and a gate 105, coupled with nanocrystals 106 embedded in a nanocrystal layer 107 between the gate layers, allows charges to be stored. The proposed nano-structure memory device not only solves the drawbacks of flash memory, namely high operating voltage and slow reading speed, but also enhances memory retention. Unlike a conventional polysilicon floating gate, the proposed nano-structure memory device has charges stored in spaced-apart nanocrystals, and the spaced-apart nanocrystals do not move in relation to each other. The proposed nano-structure memory device overcomes a drawback of the prior art, that is, it is difficult to store charges (wherein charges are stored in polysilicon which forms a floating gate to achieve electric conduction in accordance with the prior art) in the presence of a current leakage from any point of a tunnel oxide layer underlying the conventional polysilicon floating gate. Moreover, the conventional polysilicon floating gate achieves charge blocking solely by being barrier-dependent, thus causing insurmountable difficulty in a thinning-down process performed on the tunnel oxide layer. However, the nanocrystals provide insulation required for quantum confinement, so as to store charges in quantum wells. In the absence of an applied voltage, charges are confined to the quantum wells and thereby are stored, allowing the tunnel oxide layer to be thinned down further.

Although the insurmountable difficulty in the foregoing design of the polysilicon floating gate is solved (by thinning down the tunnel oxide layer and thereby enabling charges to enter the quantum wells readily and thereby be stored), but charges stored in the silicon nanocrystal floating gate may readily tunnel out and hardly be retained, because disposed between the channel and the nanocrystals is a mere insulating layer, that is, the tunnel oxide layer.

To address the foregoing problems, academics suggest that charge loss should be prevented by an improved floating gate made of self-aligned double layered silicon (R. Ohba, IEDM, December 2000). Referring to FIG. 2B (PRIOR ART), a nanocrystal structure known in the prior art is replaced with a double layered nanocrystal structure 200. Referring to FIG. 2A (PRIOR ART), the fabricating method comprises the steps of: growing a tunnel oxide layer 204 on a silicon substrate 201; depositing a silicon layer 208 on the tunnel oxide layer 204; forming an oxide layer 209 on the silicon layer 208; depositing a silicon dot 210 (Si dot) on the oxide layer 209; and oxidizing the silicon dot 210 before finalizing the self-aligned double layered silicon structure as shown in FIG. 2B (PRIOR ART). Silicon nanocrystals 211 are formed by a portion of the silicon layer 208 covered by the silicon dot 210 and thereby not oxidized. With the double layered quantum well structure, after charges are stored in the nanocrystals, it is difficult for subsequent charges to enter the nanocrystals because of Coulomb blockade. Accordingly, charges are confined to the quantum wells and are unlikely to tunnel out due to Coulomb blockade; therefore, charge retention is enhanced.

However, this method still has practical drawbacks. Although its structural theory is better than the foregoing single layered nanocrystal, but insurmountable difficulty still exists in practice when fabrication parameter is considered. If the previous level of the operating voltage is to be maintained or even lowered, the oxide layer will have to be thinned down, but the thinning down process will cause a memory retention problem. Although memory retention can be enhanced if the thickness of the oxide layer is increased, the operating voltage is compromised.

In addition to the aforesaid problems, a nanocrystal fabrication process has to address an issue, that is, the control of the formation of nanocrystals during the fabrication process. For instance, it will be impossible to store enough charges in a nanocrystal layer disposed with nanocrystals, if the nanocrystals disposed in the nanocrystal layer are too small or over-dispersed; as a result, the charges present in a channel beneath an oxidation layer decrease, causing difficulty in interpretation. In other words, in the event that few charges are stored in the nanocrystal layer, there will be a negligible difference between a threshold voltage associated with the presence of nanocrystals in the nanocrystal layer and a threshold voltage associate with the absence of nanocrystals from the nanocrystal layer, and in consequence it is impossible to determine whether charges are stored in the nanocrystal layer and perform effective interpretation. Accordingly, a nanocrystal fabrication process should be preferably provided with sufficient nanocrystals to store charges so as to create a significant difference between the threshold voltage associated with the presence of charge storage and the threshold voltage associated with the lack of charge storage, thereby enabling the memory to perform effective interpretation.

There are presently two methods for storing more charges, namely enhancing nanocrystal density, and increasing the number of charges stored in each nanocrystal. According to current technology, it is difficult to increase nanocrystal density, and thus considerations are given to attempts to store more charges in each nanocrystal. However, after a charge is stored in a nanocrystal, it is difficult for the next charge to enter the well and be stored in the nanocrystal because of an increase in potential energy. Even if the charge is forcibly stored in the well, the barrier will be insufficient to stop the charge from tunneling out; as a result, the charge tunnels into an oxide layer and fails to be stored in the nanocrystal.

Therefore, metal nanocrystal is used, which has higher charge storage density due to a metal has more states in conduction band compared to the silicon nanocrystal. Moreover, a metal with a higher work function can be chosen to be the nanocyrstal to enhance the potential barrier of a quantum well, so as to enhance charge retention.

The urgent problem to be solved is to maintain the foregoing advantages of silicon nanocrystal when operating voltage and charge retention are considered, and keep the foregoing advantages of metal crystals such as containing more charges.

SUMMARY OF THE INVENTION

In light of the above drawback of the prior art, a primary objective of the present invention is to provide a method for fabricating a nanocrystal memory element which stores more charges in a nanocrystal charge storage layer.

Another objective of the present invention is to provide a method for fabricating an insulating layer to maintain the quantum confinement of the foregoing nanocrystal to enhance charge retention with combination of the advantage of higher data storing density of a metal nanocrystal.

Still another objective of the present invention is to provide a memory having double layered silicon-metal nanocrystals.

In accordance with the foregoing and other objectives, the present invention proposes a method for fabricating a self-aligned, double layered silicon-metal nanocrystal memory element. The fabricating method comprises the steps of: providing a substrate; growing a tunnel oxide layer on the substrate; depositing a polysilicon layer on the tunnel oxide layer; depositing a dielectric layer on the polysilicon layer; implanting metal ions on the dielectric layer, wherein the metal ions are implanted as deep as the deposited polysilicon layer top; performing thermal oxidation like a rapid thermal annealing process whereby the implanted metal ions are crystallized to form metal nanocrystals; performing on the dielectric layer and the polysilicon layer a selective oxidation process, for example, a rapid thermal annealing process performed on tungsten in the presence of hydrogen-rich steam, such that silicon nanocrystals are formed by the polysilicon layer and the metal nanocrystals thereon by means of self-alignment; forming an integration layer by combining the selectively oxidized polysilicon layer with the dielectric layer; and forming a gate on the integration layer.

The present invention further provides a method for fabricating a self-aligned double layered silicon-metal nanocrystal memory element. The fabricating method comprises the steps of: providing a substrate; growing a tunnel oxide layer on the substrate; depositing a polysilicon layer on the tunnel oxide layer; depositing a dielectric layer on the polysilicon layer; depositing a metal layer on the dielectric layer; depositing another dielectric layer on the metal layer; performing thermal oxidation like a rapid thermal annealing process whereby the metal ions in the metal layer are crystallized to form metal nanocrystals; performing on the dielectric layer and the polysilicon layer a selective oxidation process, for example, a rapid thermal annealing process performed on tungsten in the presence of hydrogen-rich steam, such that silicon nanocrystals are formed by the polysilicon layer and the metal nanocrystals thereon by means of self-alignment; forming an integration layer by combining the selectively oxidized polysilicon layer with the dielectric layer; and forming a gate on the integration layer.

As regards a method for fabricating a self-aligned double layered silicon-metal nanocrystal memory element of the present invention, with selective oxidation, the polysilicon disposed beneath and thereby covered with the metal nanocrystals are not oxidized, whereas the polysilicon not disposed beneath and thereby not covered with the metal nanocrystals are oxidized. With a self-aligned silicon-metal nanocrystal structure formed in the aforesaid manner, the metal nanocrystals and the silicon nanocrystals can be formed by self-alignment.

The present invention further provides a self-aligned double layered silicon-metal nanocrystal memory element comprising a substrate, a tunnel oxide layer formed on the substrate, an integration layer formed on the tunnel oxide layer, and a gate formed on the integration layer. The integration layer comprises a dielectric material, and a plurality of metal nanocrystals and silicon nanocrystals disposed in the dielectric material. The metal nanocrystals and the silicon nanocrystals are formed by self-alignment.

As regards a self-aligned double layered silicon-metal nanocrystal memory element of the present invention, the silicon nanocrystals underlying the metal nanocrystals act as an insulating layer for quantum confinement, such that charges are confined to quantum wells and therefore unlikely to get lost. Moreover, the metal nanocrystals have relatively high work function, and thus potential barrier of the nanocrystals increases. The metal nanocrystals have more states in conduction band to store more charges. Thus potential energy does not increase and potential barrier does not decrease, after a charge has entered. Accordingly, charge retention of a nanocrystal memory is enhanced dramatically.

The present invention further proposes a nanocrystal memory with a self-aligned double layered silicon-metal nanocrystal memory element. The proposed nanocrystal memory comprises a substrate, a source and a drain both formed on the substrate and spaced apart by an appropriate distance, a tunnel oxide layer formed on the substrate and disposed between the source and the drain, an integration layer formed on the tunnel oxide layer, and a gate formed on the integration layer. The integration layer comprises a dielectric material, and a plurality of metal nanocrystals and silicon nanocrystals disposed in the dielectric material. The metal nanocrystals and the silicon nanocrystals are formed by self-alignment.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The present invention, which relates to a self-aligned double layered silicon-metal nanocrystal memory element, a method for fabricating the same, and a memory having the memory element, is herein illustrated with the specific embodiments and drawings.

FIGS. 3A through 3G demonstrate a method for fabricating a self-aligned double layered silicon-metal nanocrystal memory element of the present invention.

Figure 1:
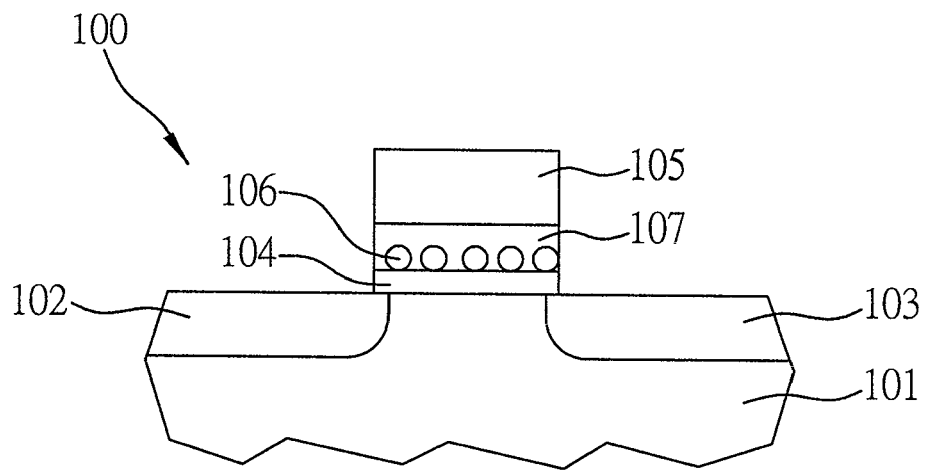
FIG. 1 (PRIOR ART) is a cross-sectional view of a conventional nanocrystal memory.
Figure 2A:
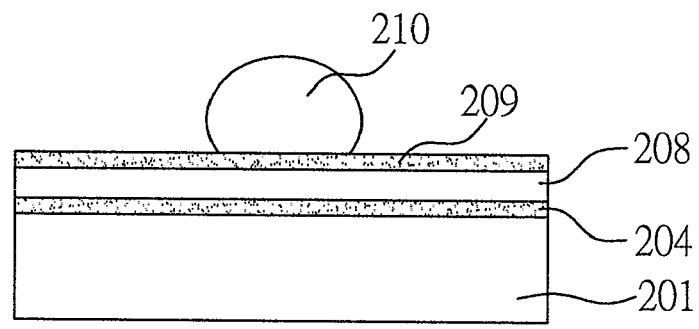
FIG. 2A (PRIOR ART) is a cross-sectional view of a conventional double layered silicon nanocrystal memory element before oxidation.
Figure 2B:
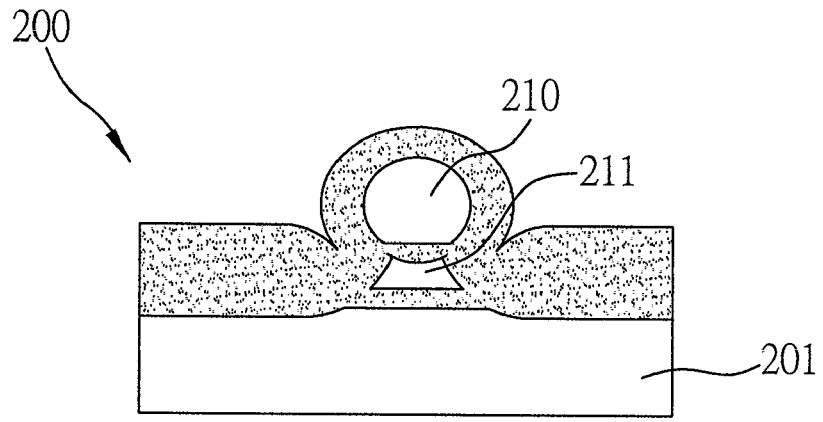
FIG. 2B (PRIOR ART) is a cross-sectional view of a conventional double layered silicon nanocrystal memory element.
Figure 3A:
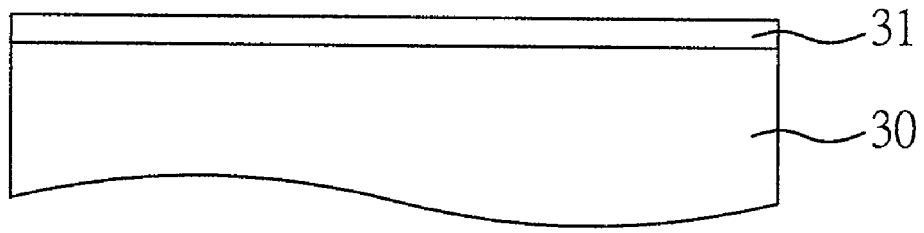
FIG. 3A demonstrates a tunnel oxide layer formed on the substrate according to the embodiment of the present invention.

Referring to FIG. 3A, first of all, a tunnel oxide layer 31 is formed on a silicon-made substrate 30 by thermal oxidation known in the prior art. The tunnel oxide layer 31 may be made of silicon oxides or other dielectric materials and preferably 5 nanometers in thickness. The formation of the tunnel oxide layer 31 is an application of technology known in the prior art, and the constituent material is also known in the prior art, and thus it is not herein discussed in detail.

Figure 3B:
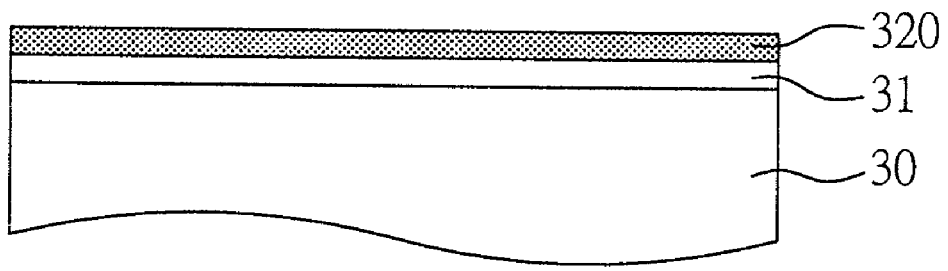
FIG. 3B, which is similar to FIG. 3A, demonstrates a polysilicon layer formed on the tunnel oxide layer according to the embodiment of the present invention.
Figure 3C:
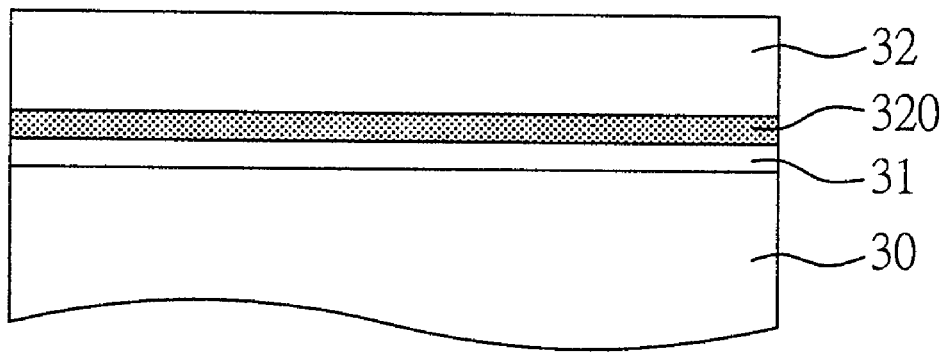
FIG. 3C, which is similar to FIG. 3B, demonstrates a dielectric layer deposited on the polysilicon layer according to the embodiment of the present invention.

Moreover, referring to FIG. 3B, a polysilicon layer 320 is deposited on the tunnel oxide layer 31. Referring to FIG. 3C, a dielectric layer 32 is deposited on the polysilicon layer 320, and the dielectric layer 32 is made of a dielectric material known in the prior art, such as silicon oxides. Since it is known in the prior art, therefore, it is not herein discussed in detail.

Figure 3D:
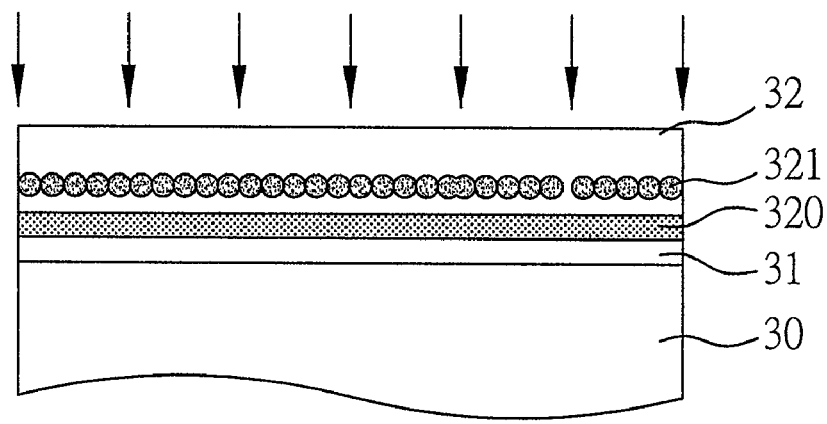
FIG. 3D, which is similar to FIG. 3C, demonstrates implantation of metal ions in the dielectric layer according to the embodiment of the present invention.
Figure 4A:
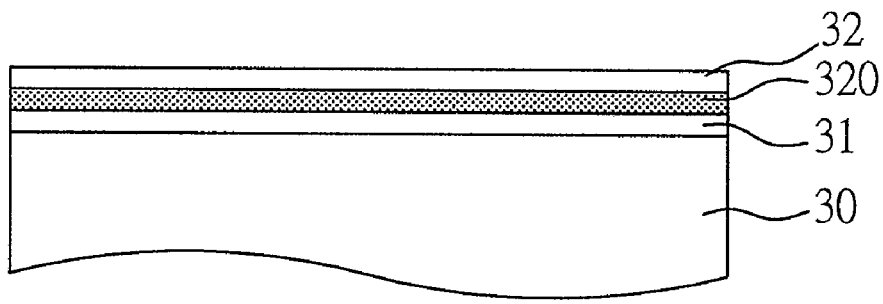
FIG. 4A demonstrates deposition of a dielectric layer on the polysilicon layer according to the alternative embodiment of the present invention.
Figure 4B:
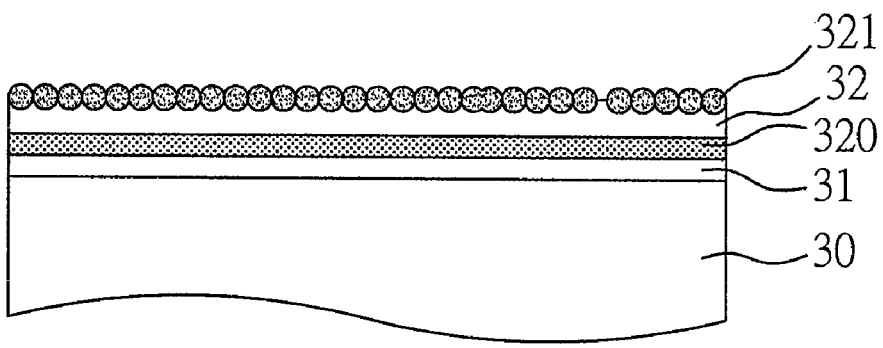
FIG. 4B, which is similar to FIG. 4A, demonstrates deposition of a metal layer on the dielectric layer according to the alternative embodiment of the present invention.
Figure 4C:
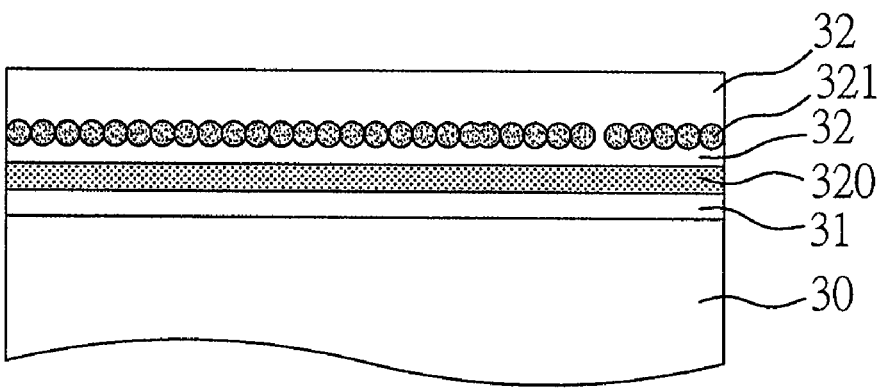
FIG. 4C, which is similar to FIG. 4B, demonstrates deposition of a dielectric layer on the metal layer according to the alternative embodiment of the present invention.

Referring to FIG. 3D, metal ions 321 are implanted in the dielectric layer 32 as deep as the top of the deposited polysilicon layer 320. Moreover, the foregoing metal ion implantation can be replaced by methods described in FIGS. 4A through 4C. Referring to FIG. 4A, a dielectric layer 32 is deposited on the polysilicon layer 320. As shown in FIG. 4B, a metal layer 321 is deposited. Then, another dielectric layer 32 is deposited on the deposited metal layer 321 as shown in FIG. 4C. Furthermore, in addition to the foregoing metal ion implantation and metal layer deposition, other appropriate methods can be used.

Figure 3E:
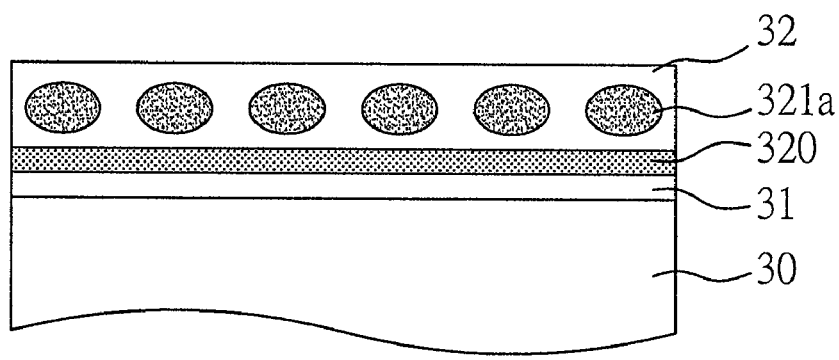
FIG. 3E, which is similar to FIG. 3D, demonstrates how a thermal oxidation process, such as rapid thermal annealing, is performed such that the metal ions are crystallized to form metal nanocrystals according to the embodiment of the present invention.

Referring to FIG. 3E, a thermal oxidation process, such as rapid thermal annealing, is performed, after formation of the metal ions 321 in the dielectric layer 32, such that metal nanocrystals 321a are formed by crystallizing the metal ions 321 formed in the dielectric layer 32. Moreover, the rapid thermal annealing process is performed at temperature that ranges between 800° C. and 1200° C., and the rapid thermal annealing process is not the only method for forming the metal nanocrystal 321a, as a nitriding process and other appropriate methods can also be used.

Figure 3F:
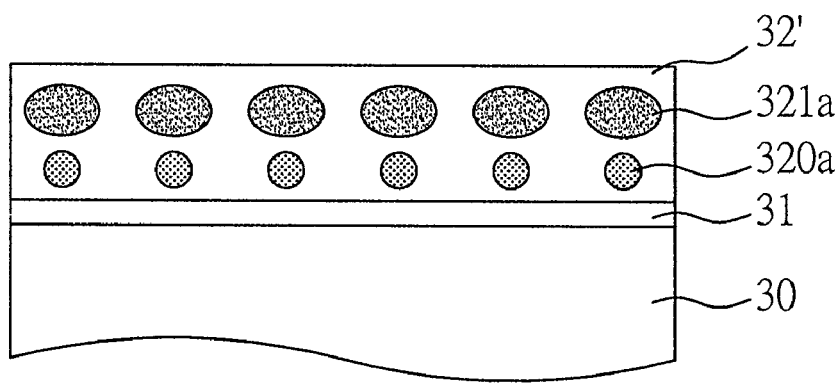
FIG. 3F, which is similar to FIG. 3E, demonstrates formation of a self-aligned double layered silicon-metal nanocrystal structure according to the embodiment of the present invention.

Then, referring to FIG. 3F, selective oxidation is performed, such that the polysilicon disposed beneath and thereby covered with the metal nanocrystals 321a are not oxidized, whereas the remaining polysilicon not disposed beneath and thereby not covered with the metal nanocrystals 321a are oxidized; then an integration layer 32' is formed by combining the dielectric layer 32 with both silicon nanocrystals 320a formed by the non-oxidized polysilicon lying beneath the metal nanocrystals and the oxidized polysilicon not disposed beneath the metal nanocrystals 321a. Accordingly, a silicon-metal nanocrystal structure is formed by self-alignment. In the present embodiment, the selective oxidation is performed so as to prevent the metal nanocrystals 321a from being oxidized while oxidation of the polysilicon layer 320 underlying the metal nanocrystals 321a is under way. Hence, the method for fabricating silicon nanocrystals 320a is not limited to selective oxidation, as any methods which can oxidize the uncovered polysilicon underlying the metal nanocrystals are appropriate and applicable. Furthermore, the embodiment of the selective oxidation can be achieved by performing a rapid thermal annealing process on tungsten in the presence of hydrogen-rich steam.

Figure 3G:
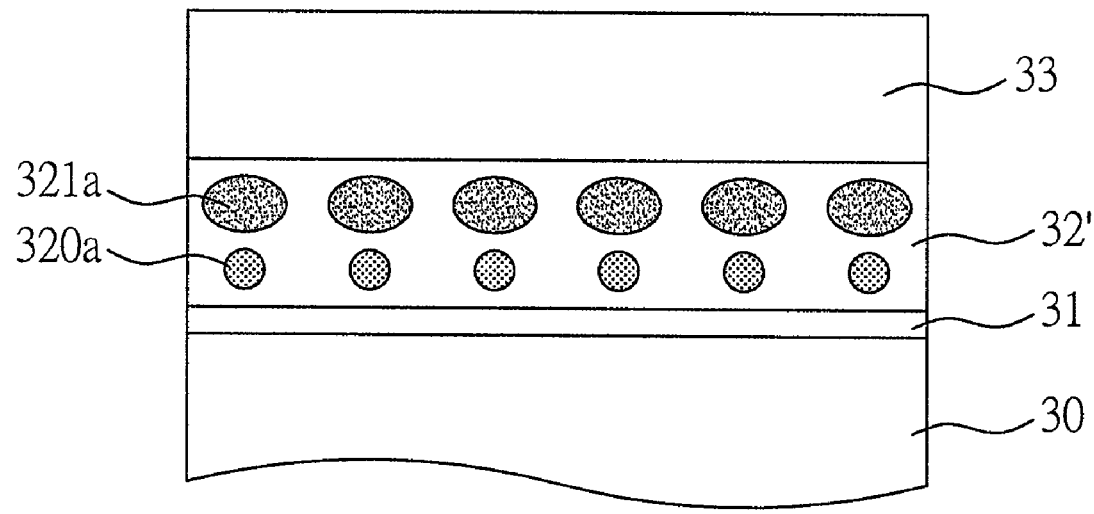
FIG. 3G, which is similar to FIG. 3F, demonstrates a gate fabrication process according to the embodiment of the present invention.

Finally, referring to FIG. 3G, a gate 33 is formed on the integration layer 32'. The gate 33 is formed by a conventional method like chemical vapor deposition, and a conventional material, such as doped polysilicon, may be used. The fabrication process of the double layered silicon-metal nanocrystal memory element of the present invention is completed after the gate 33 is formed.

Figure 5:
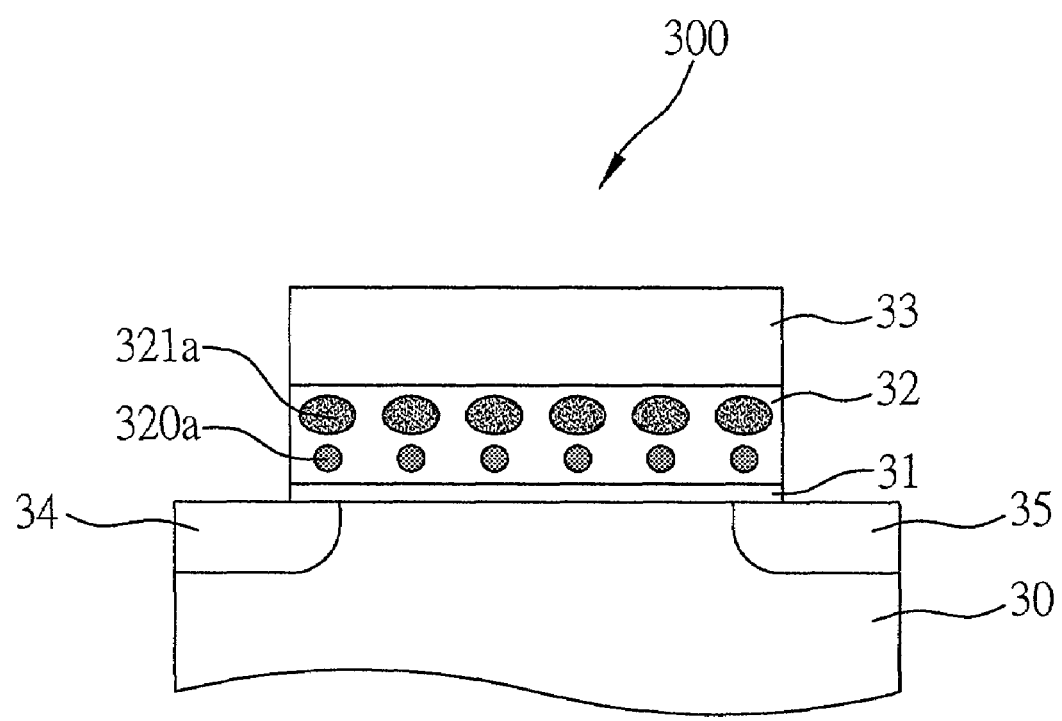
FIG. 5 is a cross-sectional view of a nanocrystal memory of the present invention.

Furthermore, FIG. 5 demonstrates a memory 3 which comprises the foregoing memory element. As shown in FIG. 5, the memory 3 comprises a substrate 30, a tunnel oxide layer 31 formed on the substrate 30, an integration layer 32' formed on the tunnel oxide layer 31, a gate 33 formed on the integration layer 32', a source 34 and a drain 35 both formed in the substrate 30, both the source 34 and the drain 35 flanking and underlying the tunnel oxide layer 31. As mentioned above, a plurality of metal nanocrystals 321a and silicon nanocrystals 320a are disposed in the integration layer 32'. The metal nanocrystals 321a and the silicon nanocrystals 320a are stacked by self-alignment.

The present invention is illustrated above with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

What is claimed is:

1. A method for fabricating a self-aligned, double layered silicon-metal nanocrystal memory element, the method comprising the steps of:
   providing a substrate;
   growing a tunnel oxide layer on the substrate;
   depositing a polysilicon layer on the tunnel oxide layer;
   forming a dielectric layer on the polysilicon layer;
   forming metal ions in the dielectric layer;
   forming metal nanocrystals by crystallizing the metal ions;
      forming silicon nanocrystals in the polysilicon layer under the metal nanocrystals, forming an integration layer by combining the dielectric layer and a portion of the polysilicon layer in which none of the silicon nanocrystals have been formed, wherein the silicon nanocrystals and the metal nanocrystals are stacked by self-alignment; and
   forming a gate on the integration layer.

2. The method for fabricating a self-aligned double layered silicon-metal nanocrystal memory element of claim 1, wherein the metal ions are formed in the dielectric layer by ion implantation.

3. The method for fabricating a self-aligned double layered silicon-metal nanocrystal memory element of claim 2, wherein the metal ions are implanted in the dielectric layer as deep as the deposited polysilicon layer top.

4. The method for fabricating a self-aligned double layered silicon-metal nanocrystal memory element of claim 1, wherein the metal ions are formed in the dielectric layer by depositing a metal layer in the dielectric layer.

5. The method for fabricating a self-aligned double layered silicon-metal nanocrystal memory element of claim 1, wherein the metal nanocrystals are formed by thermal oxidation.

6. The method for fabricating a self-aligned double layered silicon-metal nanocrystal memory element of claim 5, wherein the thermal oxidation is a rapid thermal annealing process.

7. The method for fabricating a self-aligned double layered silicon-metal nanocrystal memory element of claim 1, wherein the silicon nanocrystals are formed by selective oxidation of the polysilicon layer which allows the silicon nanocrystals to be formed in a non-oxidized portion of the polysilicon layer.

8. The method for fabricating a self-aligned double layered silicon-metal nanocrystal memory element of claim 7, wherein the selective oxidation is a rapid thermal annealing process performed on tungsten in the presence of hydrogen-rich steam.

* * * * *